(12) United States Patent
Choi et al.

(10) Patent No.: US 12,089,387 B2
(45) Date of Patent: Sep. 10, 2024

(54) METHODS AND DEVICES FOR ELECTROMAGNETIC WAVE ABSORPTION USING GRADIENT, COATED HONEYCOMB STRUCTURES

(71) Applicants: Khalifa University of Science and Technology, Abu Dhabi (AE); Korea University Research and Business Foundation, Seoul (KR)

(72) Inventors: Daniel Choi, Abu Dhabi (AE); Hammad Younes, Abu Dhabi (AE); Ru Li, Abu Dhabi (AE); Young Keun Kim, Seoul (KR)

(73) Assignees: Khalifa University of Science and Technology, Abu Dhabi (AE); Korea University Research and Business Foundation, Seoul (KR)

( * ) Notice: Subject to any disclaimer, the term of this patent is extended or adjusted under 35 U.S.C. 154(b) by 403 days.

(21) Appl. No.: 17/392,898

(22) Filed: Aug. 3, 2021

(65) Prior Publication Data

US 2023/0041555 A1 Feb. 9, 2023

(51) Int. Cl.
*H05K 9/00* (2006.01)
*C04B 35/26* (2006.01)
*C04B 41/50* (2006.01)

(52) U.S. Cl.
CPC .......... *H05K 9/0088* (2013.01); *C04B 35/26* (2013.01); *C04B 41/5001* (2013.01); *C04B 2235/3272* (2013.01)

(58) Field of Classification Search
None
See application file for complete search history.

(56) References Cited

FOREIGN PATENT DOCUMENTS

| CN | 109337114 A | * | 2/2019 | ............... C08J 9/40 |
| CN | 110290689 A | * | 9/2019 | |
| CN | 111224245 B | | 2/2021 | |

OTHER PUBLICATIONS

An, B.H. , et al., "Microwave absorption properties of magnetite multi-granule nanocluster-multiwall carbon nanotube composites", Functional Materials Letters, 12 (2019) 1950011.
(Continued)

*Primary Examiner* — Jeffrey D Washville
(74) *Attorney, Agent, or Firm* — Billion & Armitage (57) ABSTRACT

A device and method for absorbing electromagnetic waves can include a honeycomb sheet formed by a plurality of interconnected hexagon cells arranged in rows. The hexagon cells are made up of sidewalls, each sidewall formed by two surfaces that converge at a top of the sidewall and diverge from the top to a bottom of the sidewall such that a thickness of the sidewalls increases from top to bottom and an angle forms between the two surfaces at the top of the sidewall. In an example, the angle is about 8 degrees. The honeycomb sheet can be coated with a magnetic, composite coating to increase electromagnetic shielding. An example coating includes magnetic multi-granular nanoclusters (MGNC) and multi-walled carbon nanotubes (MWCNT). A base layer can be attached to the honeycomb sheet for mechanical stability and additional absorption. The device is suitable for radar absorbing materials (RAM) for aerospace and military applications.

20 Claims, 8 Drawing Sheets

(56) References Cited

OTHER PUBLICATIONS

Bai, X., et al., "Green Approach To Prepare Graphene-Based Composites with High Microwave Absorption Capacity", The Journal of Physical Chemistry C, 115 (2011) 11673-11677.

Choi, W.-H., et al., "Broadband microwave-absorbing honeycomb structure with novel design concept", Composites Part B: Engineering, 83 (2015) 14-20.

Han, M., et al., "Graphene-wrapped ZnO hollow spheres with enhanced electromagnetic wave absorption properties", Journal of Materials Chemistry A, 2 (2014) 16403-16409.

He, Y., et al., "Preparation and microwave absorption properties of metal magnetic micropowder-coated honeycomb sandwich structures", Smart materials and structures, 16 (2007) 1501.

Jang, J.-U., et al., "Enhanced electrical and electromagnetic interference shielding properties of uniformly dispersed carbon nanotubes filled composite films via solvent-free process using ring-opening polymerization of cyclic butylene terephthalate", Polymer, 186 (2020) 122030.

Jou, W.S., et al., "Electromagnetic Shielding of Nylon-66 Composites Applied to Laser Modules", Journal of electronic Materials, 30 (2001) 1287-1293.

Khurram, A.A., et al., "Optimization of the Carbon Coating of Honeycomb Cores for Broadband Microwave Absorption", IEEE Transactions on Electromagnetic Compatibility, 56 (2014) 1061-1066.

Kong, L., et al., "Electromagnetic Wave Absorption Properties of Reduced Graphene Oxide Modified by Maghemite Colloidal Nanoparticle Clusters", The Journal of Physical Chemistry C, 117 (2013) 19701-19711.

Liu, M., et al., "Polymer nanocomposites with improved mechanical and thermal properties by magnetically aligned carbon nanotubes", Polymer, 166 (2019) 81-87.

Luan, X., et al., "Improving mechanical properties of PVA based nano composite using aligned single-wall carbon nanotubes", Materials Research Express, 6 (2019) 1050a1056.

Rao, B.V.B., et al., "Physical Chemistry Chemical Physics", 17 (2015) 18353-18363.

Shen, B., et al., "Lightweight, Multifunctional Polyetherimide/Graphene@Fe3O4 Composite Foams for Shielding of Electromagnetic Pollution", ACS applied materials & interfaces, 5 (2013) 11383-11391.

Sun, X., et al., "Laminated magnetic graphene with enhanced electromagnetic wave absorption properties", Journal of Materials Chemistry C, 1 (2013) 765-777.

Xu, Y., et al., "Flexible and highly conductive sandwich nylon/nickel film for ultra-efficient electromagnetic interference shielding", Applied Surface Science, 455 (2018) 856-863.

Xu, Y., et al., "Light-Weight Silver Plating Foam and Carbon Nanotube Hybridized Epoxy Composite Foams with Exceptional Conductivity and Electromagnetic Shielding Property", ACS applied materials & interfaces, 8 (2016) 24131-24142.

Younes, Hammad, et al., "Gradient 3D-printed honeycomb structure polymer coated with a composite consisting of Fe3O4 multigranular nanoclusters and multi-walled carbon nanotubes for electromagnetic wave absorption", Synthetic Metals 275 (Feb. 2021) 116731 9 pages.

Younes, H., et al., "Processing and property investigation of high-density carbon nanostructured papers with superior conductive and mechanical properties", Diamond and Related Materials, 68 (2016) 109-117.

Younes, H., et al., "Thin carbon nanostructure mat with high electromagnetic interference shielding performance", Synthetic Metals, 253 (2019) 48-56.

Zhang, L., et al., "Phthalonitrile-Based Carbon Foam with High Specific Mechanical Strength and Superior Electromagnetic Interference Shielding Performance", ACS applied materials & interfaces, 8 (2016) 7422-7430.

Zhao, H., et al., "Enhanced X-Band Electromagnetic-Interference Shielding Performance of Layer-Structured Fabric-Supported Polyaniline/ Cobalt-Nickel Coatings", ACS applied materials & interfaces, 9 (2017) 33059-33070.

"Notice of Preliminary Rejection Mailed on Nov. 17, 2022", for Application No. 10-2021-0141302, 11 Pages.

An, Boo Hyun, et al., "Microwave absorption properties of magnetite multi-granule nanoclustermultiwall carbon hanotube composites", 5 Pages.

Luo, Hui, et al., "A novel two-layer honeycomb sandwich structure absorber with highperformance microwave absorption", 7 Pages.

Pei, Zhao, et al., "Electromagnetic property of a novel gradient honeycomb composite fabricated by 3D forming", 9 Pages.

\* cited by examiner

METHODS AND DEVICES FOR ELECTROMAGNETIC WAVE ABSORPTION USING GRADIENT, COATED HONEYCOMB STRUCTURES

BACKGROUND

Modern day life is easier and more enjoyable due to the widespread availability and use of electronic devices. However, a downside is that electronics cause an increased exposure to electromagnetic wave radiation. Electromagnetic wave radiation can have adverse health effects on humans, animals, and can also hamper the operation of other nearby electronic devices. This rapidly growing problem has promoted the need for new materials that can absorb electromagnetic waves, but also decrease reflection waves.

Metal-based materials have been extensively utilized for electromagnetic wave shielding given their high electrical conductivity values and super-mechanical properties. However, some of the challenges with metals are their heavy weight, poor flexibility, undesirable corrosion susceptibility, and high processing costs, especially in the aerospace industry where lightweight materials are preferred. Polymer composites can have remarkable mechanical properties along with high electrical and thermal conductivity, yet a nano-composite made of carbon nanomaterials and polymer(s) may require relatively intricate processing, leading to high manufacturing costs. Graphene has been used as electromagnetic wave absorption materials in certain applications. However, poor processability, scalability and weak mechanical properties can be disadvantages of graphene composites.

Three-dimensional printing technology can be an effective and popular technique to fabricate 3D structures as it is low-cost, environmentally friendly, easy to use and capable of fabricating sophisticated structures with a variety of sizes and high resolution.

There is a need for efficient, electromagnetic wave absorbing materials and structures that are lightweight and demonstrate a strong wave absorption property and a broad absorption bandwidth in a wide incident angle.

SUMMARY

According to one or more aspects of the invention, a honeycomb structure for absorbing electromagnetic waves can include a honeycomb sheet formed by a plurality of interconnected hexagon cells arranged in rows, the hexagon cells made up of sidewalls, each sidewall having a thickness and a height, the height defined between a top and a bottom of the sidewall. The thickness of the sidewall, defined between two surfaces of the sidewall, increases along the height of the sidewall from the top to the bottom, and the two surfaces that form the sidewall converge at the top of the sidewall to form an angle greater than 2 degrees. A magnetic coating, applied to an exterior of the honeycomb sheet, can be used to increase electromagnetic shielding of the honeycomb structure.

According to one or more aspects of the invention, a device for electromagnetic wave absorption can include a honeycomb structure formed of multiple rows of interconnected, hollow hexagon cells, the hexagon cells formed of a plurality of gradient sidewalls, each gradient sidewall having a top, a bottom, an exterior surface and an interior surface, a height of the sidewall defined between the top and bottom, a thickness of the sidewall defined between the exterior and interior surfaces. The exterior and interior surfaces converge at the top of the sidewall and diverge from the top to the bottom such that the thickness is variable and increases from the top to the bottom of the sidewall, and an angle formed between the exterior and interior surfaces at the top of the sidewall is about 8 degrees. The device can further include a base layer attached to a bottom of the honeycomb structure and a composite coating applied to the honeycomb structure and the base layer, the composite coating comprising magnetic multi-granular nanoclusters (MGNC) and multi-walled carbon nanotubes (MWCNT).

According to one or more yet further aspects of the invention, a method of forming a gradient, coated honeycomb structure for use in absorbing electromagnetic waves can include forming a honeycomb sheet having multiple rows of cells, each row of cells having a plurality of interconnected, hexagon cells formed by multiple sidewalls, each sidewall having a thickness and a height, the height defined between a top and a bottom of the sidewall, the thickness of the sidewall defined between two surfaces of the sidewall and increasing along the height of the sidewall from the top to the bottom, and the two surfaces that form the sidewall converge at the top of the sidewall to form an angle greater than 2 degrees. The method can further include coating the honeycomb sheet with a magnetic, composite coating configured to increase electromagnetic shielding of the honeycomb structure.

This summary is intended to provide an overview of subject matter of the present disclosure. It is not intended to provide an exclusive or exhaustive explanation of the invention. The detailed description is included to provide further information about the present patent application.

BRIEF DESCRIPTION OF THE DRAWINGS

In the drawings, which are not necessarily, drawn to scale, like numerals may describe similar components in different views. The drawings illustrate generally, by way of example, but not by way of limitation, various embodiments discussed herein.

DETAILED DESCRIPTION

The present disclosure is directed to three-dimensional (3D) honeycomb structures for use in electromagnetic wave absorption. The honeycomb structures are formed by a plurality of hexagon cells interconnected and arranged in multiple rows. The honeycomb structures are designed such that a thickness of the honeycomb is not uniform, resulting in a tilt angle. More specifically, the sidewalls that form the repeating hexagons, which form the honeycomb, are of varying thickness. The non-uniformity of the hexagons in the honeycomb structure is referred to herein as a gradient or a gradient feature. The gradient honeycomb can have a tilt angle of approximately four degrees. The tilt angle can reduce the mismatch when the electromagnetic wave incidents on the surface, leading to increased absorption and decreased reflection. The honeycomb can be formed of one or more polymer materials via three-dimensional printing. The gradient honeycomb structure can be coated with one or more magnetic materials to improve reflection loss and electromagnetic shielding. The coating can include one or more polymers or a polymer in combination with another material. The coating can include nanocomposite materials such as multi-walled nanotubes (MWNTs), single-walled nanotubes (SWNTs), 3D graphene and metal oxide spinel structure nanoparticles. In an example, the coating can be a nanocomposite of multi-granular nanoclusters (MGNCs) and multi-walled carbon nanotubes (MWCNTs). In an example, the MGNCs can be iron oxide $Fe_3O_4$. Coating can be applied via spray coating. In an example, the thickness of the coating can range from about 100 to about 500 microns. In another example, the thickness can range from about 150 to about 200 microns. The target thickness can depend in part on the type of electromagnetic waves that are of primary interest for a particular application.

The honeycomb structures described herein can be used as radar absorbing materials (RAM) for aerospace and military applications. Such materials have gained a fundamental role in civil, aerospace, and military applications that require sufficient control of the electromagnetic (EM) environment, such as, for example, design of 'stealth' aircraft against air-based radar surveillance. Such materials are characterized not only by their high shielding properties against EM fields, but also by their low reflection coefficient over a defined frequency range of the EM spectrum. An objective of 'stealth' designs is to reduce the radar cross-section (RCS) of the potential targets in order for aircraft and vehicles to be less detectable to hostile radar surveillance systems.

The honeycomb structures described herein can be used for electromagnetic interference (EMI). The rapid growth of high frequency electromagnetic energy emissions has become a modern dilemma that impacts virtually all electronic systems, ranging from daily life to, as an example, space exploration. Shielding methods can be used to increase the lifetime and efficiency of electronic devices, as well as reduce exposure to radiation.

As used herein, a "honeycomb" or "honeycomb structure" refers to a three-dimensional periodic cellular structure that is relatively lightweight, yet robust and rigid. The honeycomb structure is constructed from a layer of hexagonal hollow cells that are interconnected and assembled in multiple rows; such layer of cells can be attached to a base layer. Honeycomb composites can be fabricated from different kind of materials such as metal-based materials, polymers or composites. Honeycomb structures can have a high mechanical-to-mass strength ratio and the capability to handle high power, due to heat dissipation. As used herein, "gradient" refers to the varying thickness of the sidewalls that form the honeycomb structure; more specifically, "gradient" refers to the increasing thickness of the sidewalls from the top to the bottom of the honeycomb cell. As used herein, "non-gradient" refers to a honeycomb structure with cells having sidewalls of generally uniform thickness along the height of the sidewall.

Figure 1A:
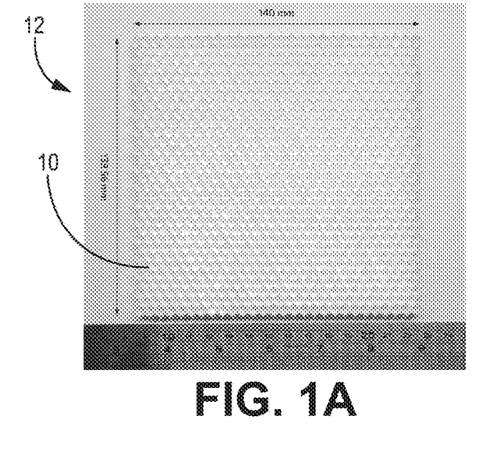
FIG. 1A is a photographic image of a honeycomb structure, according to one or more embodiments of the present disclosure.
Figure 1B:
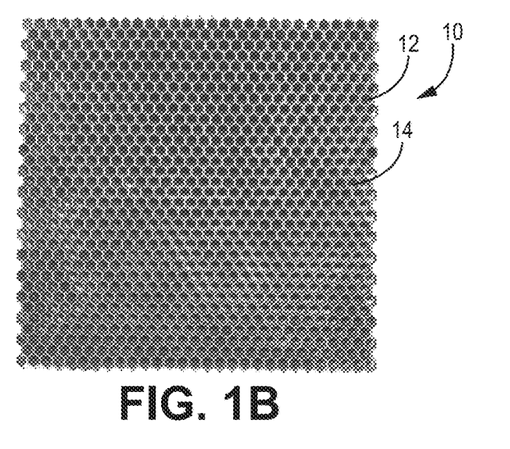
FIG. 1B is a photographic image of the honeycomb structure of FIG. 1A after a coating has been applied, according to one or more embodiments of the present disclosure.
Figure 1C:
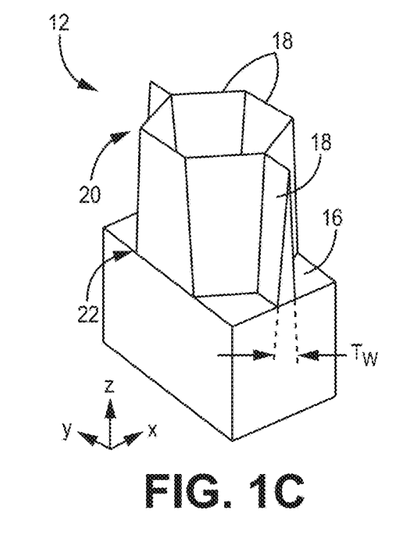
FIG. 1C is a perspective view schematic of a hexagon that forms the honeycomb structure of FIG. 1A, according to one or more embodiments of the present disclosure.

FIG. 1A is a photographic image of an uncoated honeycomb structure 10 having multiple rows of hexagon cells 12 and a base layer (see FIG. 1C). The hexagon cells are hollow such that there is free or open space between the walls forming the cells. In the photograph of FIG. 1A, the honeycomb structure 10 is approximately 140×140 mm. It is recognized that the honeycomb structures disclosed herein can be larger or smaller than the honeycomb structure 10 of FIG. 1A. In an example, the honeycomb structure 10 is 3D-printed from nylon material. It is recognized that other materials can be used, such as, metal-based materials, polymers or composites. In addition to or as an alternative to 3D printing, other fabrication methods can be used, including, but not limited to, inkjet printing and molding techniques. FIG. 1B is a photographic image of the honeycomb structure 10 after a coating 14 has been applied. The coating 14 is described further below in reference to FIGS. 2-4B.

FIG. 1C shows a single hexagon cell 12 from the honeycomb structure 10, as well as a base layer 16 that runs a length and a width of the honeycomb structure 10 and attaches to or is integral with the hexagon cells 12. The base layer 16 can provide mechanical stability and also contribute to overall absorption by the structure 10.

Figure 1D:
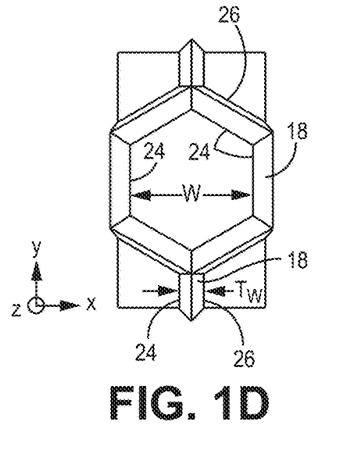
FIG. 1D is a top view schematic of the hexagon of FIG. 1C, according to one or more embodiments of the present disclosure.
Figure 1E:
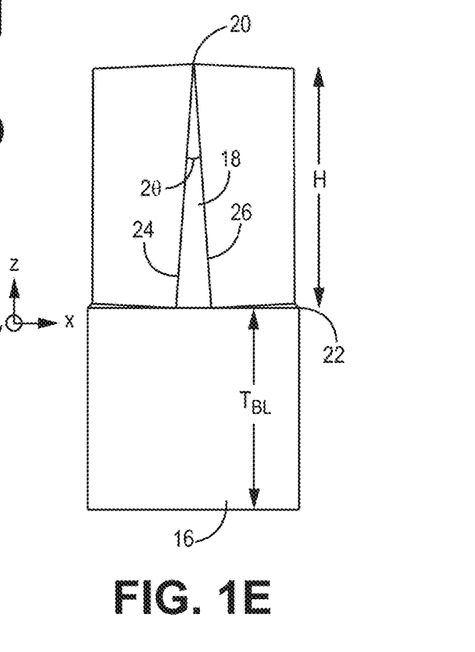
FIG. 1E is a side view schematic of the hexagon of FIG. 1C, according to one or more embodiments of the present disclosure.

Each cell 12 can include six sides 18 that form a hexagon. The hexagon cells 12 are interconnected and each of the six sides of one hexagon are also part of a neighboring hexagon, except for the outermost sides along an edge of the structure 10. FIG. 1D is a top view of the hexagon cell 12 of FIG. 1C; FIG. 1E is a side view.

A width W of the hexagon cell 12 can define a size of the cells 12 that form the structure 10. The width W can be defined as the spacing between inner surfaces 24 of opposing sides 18 of the cell 12. The width W can range from about 3 to about 7 mm, from about 4 to about 6 mm, and from about 4.5 to 5.5 mm. The hexagon cell 12 can have a height H (defined between a top 20 and a bottom 22 of the cell 12) and the base layer 16 can have a height or thickness $T_{BL}$. The height H can range from about 8 mm to about 12 mm, from about 9 to about 11 mm, and from about 9.5 to 10.5 mm. The base layer thickness $T_{BL}$ can range from about 5 to about 9 mm, from about 6 to about 8 mm, and from about 6.5 to about 7.5 mm.

A thickness $T_W$ of the hexagon sides 18 or sidewalls 18 can be variable (or gradient), resulting in a tilt angle θ. The thickness $T_W$ at the top 20 of the side 18 can be less than the thickness $T_W$ at the bottom 22 of the side 18 such that the thickness $T_W$ of the side 18 increases from top 20 to bottom 22. The thickness $T_W$ can range from about 40 μm to about 1 mm, depending in part on where along the height H of the side 18 the thickness $T_W$ is measured. In an example, the thickness $T_W$ at or near the bottom 22 can be about 1 mm; and the thickness $T_W$ near the top 20 can be much smaller, such as 40-100 μm. The specific value near the top 20 can depend in part on the tilt angle.

Each side or sidewall 18 can have an inner surface 24 and an outer surface 26. The thickness $T_W$ is defined between the inner surface 24 and the outer surface 26. Note that the outer surface 26 of a particular hexagon cell 12 may be the inner surface 24 of an adjacent cell 12. As shown in FIG. 1E, at the top 20, the thickness $T_W$ of the side 18 is essentially zero since the two surfaces 24 and 26 intersect at the top 20. In another example, the two surfaces 24 and 26 may not intersect at the top 20; instead, the two surfaces 24 and 26 may be separated by some distance at the top 20 and there is an angle formed between the two surfaces 24 and 26. In such example, the thickness $T_W$ near the top 20 is still markedly small, relative to the distance at and near the bottom 22. For purposes of the present disclosure, the terms "converge" or "converging", as used in reference to surfaces of the honeycomb structure 10, can include surfaces that intersect with one another at the top 20, as well as surfaces that do not intersect with one another at the top 20 and are separated by a proportionally small distance at the top 20.

The thickness $T_W$ increases along the height H from the top 20 to the bottom 22 as surfaces 24 and 26 diverge from one another. The difference in thickness at the top 20 and the bottom 22 determines the tilt angle θ of the honeycomb structure 10. In an example, the tilt angle θ is equal to or greater than 1 degree, and angle 2θ is equal to or greater than 2 degrees. The tilt angle θ can range between about 1 and about 5 degrees, and thus angle 2θ can range between about 2 and about 10 degrees. In an example, the tilt angle θ is equal to about 4 degrees; thus, angle 2θ as shown in FIG. 1E is about 8 degrees. In an example, the tilt angle θ ranges between about 3 and about 5 degrees, and thus angle 2θ range between about 6 and about 10 degrees. In yet another example, the tilt angle θ ranges between about 3.5 and about 4.5 degrees, and thus angle 2θ ranges between about 7 and about 9 degrees. In FIG. 1C, only one of the sides 18 is shown having a variable thickness. However, it is recognized that the other sides 18 of FIG. 1C similarly have increasing thickness along the height H. As provided below, the tilt angle θ can impact reflection loss and thereby improve overall wave absorption.

Similar to how the thickness $T_W$ varies along the height H, the width W of the cell 12 also varies along the height H. The width W at the top 20 can be greater than the width W at the bottom 22 given that opposing sides 18 of the cell 12 converge toward one another as the inner 24 and outer 26 surfaces of a single side 18 diverge from one another. A difference in the width W across the height H of the cell depends on the tilt angle θ.

As provided in the examples below, the honeycomb structure 10 of FIGS. 1A-1E, in which the cells 12 have the gradient feature/tilt angle and a magnetic composite coating, demonstrated decreased reflection and increased wave absorption, as compared to uncoated honeycomb structures and non-gradient honeycomb structures. Moreover, the honeycomb structure 10 of FIGS. 1A-1E had increased shielding effectiveness. Given the lightweight materials and design, in addition to improved performance, the honeycomb structure provided herein is well suited for many fields, especially aerospace and military applications.

EXAMPLES

Example 1

Figure 2:
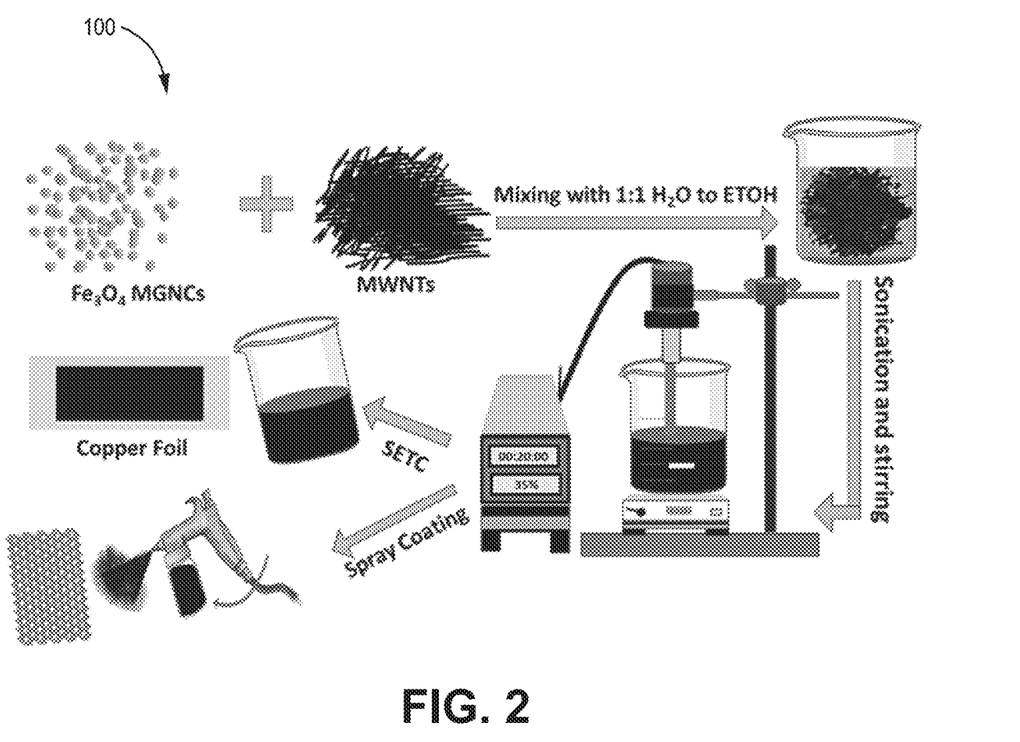
FIG. 2 is a schematic of a process for forming a coating for use on the honeycomb structure, according to one or more embodiments of the present disclosure.

Formation of the coating: A thin layer of MGNCs/MWCNT is applied to the honeycomb structure 10 as the coating 14 shown in FIG. 1B. The coating 14 can be applied using a spray gun. FIG. 2 illustrates a process 100 for preparing the coating 14 with the materials listed in Table 1 below.

TABLE 1

Materials used in preparation of MGNC-MWCNT coating

| Material | Specification | Source |
| --- | --- | --- |
| Multi-granule nanocluster composite (MGNC) | Synthesis process disclosed in: B. H. An, B. C. Park, H. A. Yassi, J. s. Lee, J-R Park, Y. K. Kim, J. E. Ryu, D. S. Choi, "Fabrication of graphene-magnetite multi-granule nanocluster composites for microwave absorption application", Journal of Composite Materials, 53 (2019) 4097-4103 | Synthesized internally, rather than purchased. |
| Multiwall carbon nanotubes (MWCNT) | MWCNT flakes comprised >93% MWCNTs, <10% fiberglass and <6% polyethylene glycol (PEG) | Applied Nanostructured Solutions LLC USA |
| Ethanol | Absolute alcohol, without additive, A15, ≥99.8% | Sigma Aldrich |
| Copper foil EQ-bccf-9u | Length: 310 m, Width: 180 mm (±1 mm), Thickness: 9 μm (−0, +3) μm, Density: 8.94 g · cm-3 Net weight: 5 kg and Tube weight: 1 kg | MTI Corporation, USA |
| Isopropanol | IPA 99% isopropyl alcohol 2.8 1 | Sigma Aldrich |

The MWCNT flakes were dispersed in 1:1 mL DI water to ethanol using a tip sonicator (VCX 750 Ultrasonic Processor from Sonics & Materials, Inc.) and a magnetic stirrer for 10 minutes. Next, MGNC was added at 5 wt % to the solution and 10 minutes of sonication was performed on the mixture before placing it in the vacuum oven for 2 minutes to remove air bubbles generated by the sonicator. Some of the mixture was cast using a doctor blade and onto a glass plate covered before the copper foil. The glass plate was then placed in the oven for 1 hour at 120° C. to dry all the solvents and form a MGNC-MWCNT mat. The remaining mixture was used with a spray gun to coat the honeycomb structure. A target thickness of the coating can be between about 150 and about 200 microns.

The MGNC-MWCNT mat was fabricated in order to evaluate permittivity and permeability and obtain equivalent parameters of the coated honeycomb structure. The electrical conductivity of the MGNC-MWCNT mat was measured to be 13 S cm$^{-1}$ using an HMS-500 Hall Effect Measurement system from Ecopia.

Figure 3A:
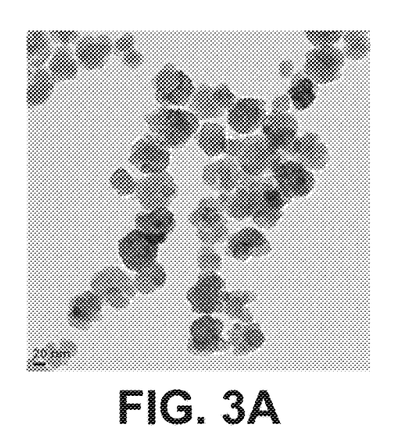
FIG. 3A is a transmission electron microscopy (TEM) image of a composite coating for use on the honeycomb structure, according to one or more embodiments of the present disclosure.
Figure 3B:
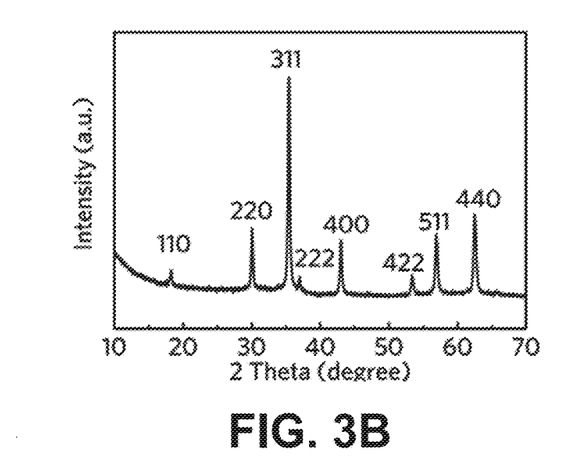
FIG. 3B is an X-ray diffraction pattern for the multi-granular nanoclusters (MGNC) of the composite coating.
Figure 3C:
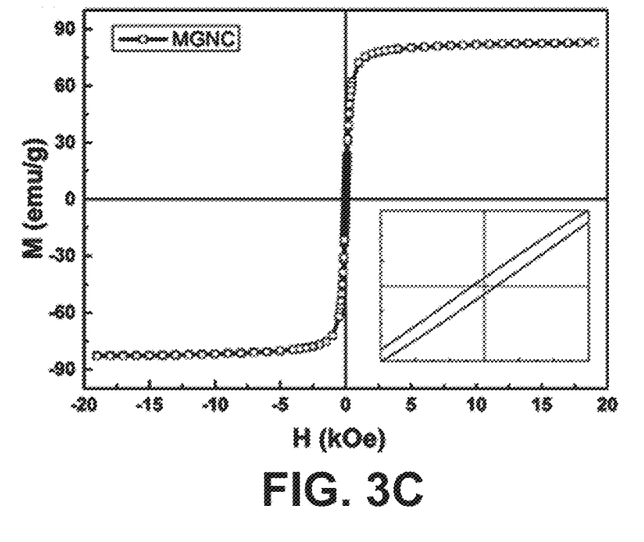
FIG. 3C is a magnetic hysteresis loop of the MGNC of the composite coating.
Figure 3D:
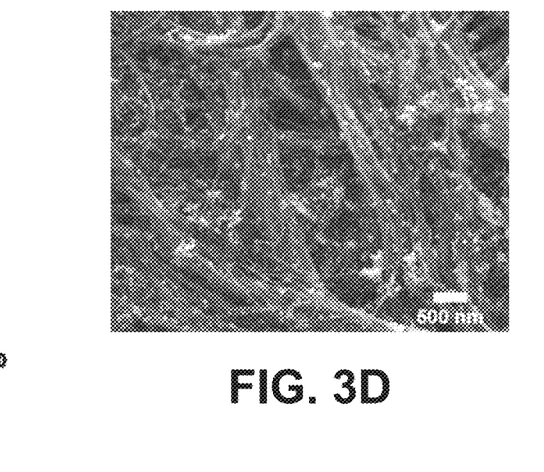
FIG. 3D is a scanning electron microscopy (SEM) image of a mat formed with the composite.

FIGS. 3A-3D illustrate different properties of the MGNC-MWCNT coating and its components. FIG. 3A is a transmission electron microscopy (TEM) image of the MGNCs having 35 nm granules and 63 nm particle diameter. The TEM image in FIG. 3A was obtained with a JEM-2011F microscope from JEOL Ltd., operating at an accelerating voltage of 200 kV. FIG. 3B is an X-ray diffraction pattern for the MGNCs obtained using a PANalytical Empyrean diffractometer. FIG. 3C is a magnetic hysteresis loop of the MGNCs, illustrating a saturation magnetization ($M_S$) value of approximately 80 emu/g and with a narrow hysteresis loop. The retentivity ($M_r$) is approximately 11.7 emu/g and coercivity ($H_C$) is approximately 55.98 G. FIG. 3D is a scanning electron microscopy (SEM) image of the MGNC-MWCNT mat, illustrating an interconnected network structure of MWCNTs and the MGNCs well dispersed within the network structure. The network structure is built up of many layers and interfaces, as shown in the SEM image. The SEM image in FIG. 3D was obtained with a Nova NanoSEM 650 microscope from FEI Co.

Figure 4A:
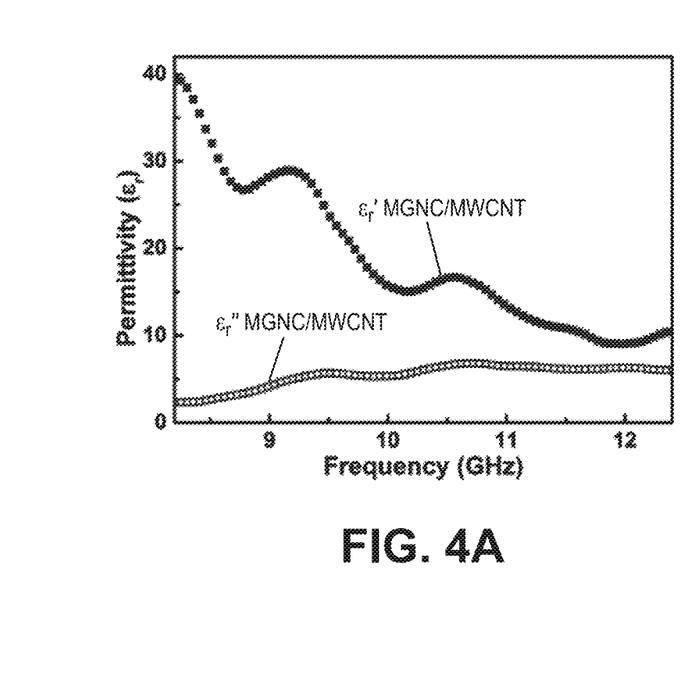
FIG. 4A is a plot of permittivity as a function of frequency for the coating.
Figure 4B:
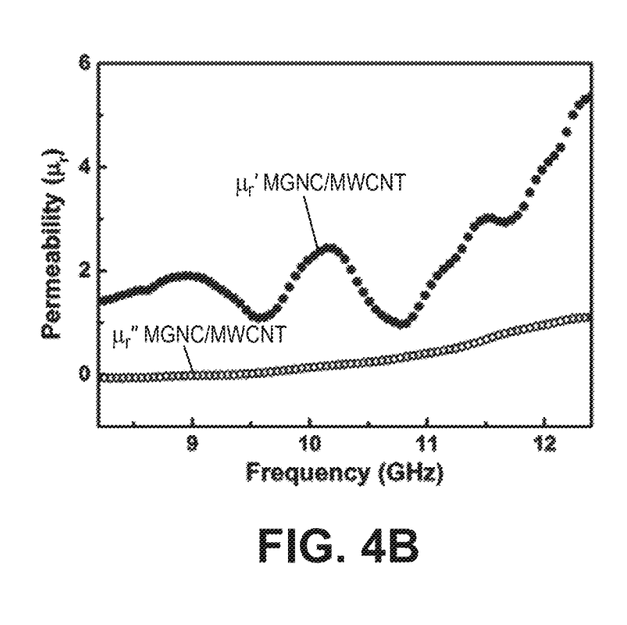
FIG. 4B is a plot of permeability as a function of frequency for the coating.

FIGS. 4A and 4B illustrate frequency-dependent electromagnetic properties of the MGNC-MWCNT coating. FIG. 4A is a plot of real permittivity ($\varepsilon_r'$) and imaginary permittivity ($\varepsilon_r''$), as a function of frequency, for the MGNC-MWCNT coating. FIG. 4A shows that the real permittivity decreases as frequency increases, whereas the imaginary permittivity increases as frequency increases. Typically, both real and imaginary permittivity of pure MWCNTs decrease in a frequency range of 0-20 GHz. As such, the presence of MGNC with MWCNTs causes the imaginary part of permittivity to increase, which accounts for the improvement in reflection loss. FIG. 4B is a plot of real permeability ($\mu_r'$) and imaginary permeability ($\mu_r''$), as a function of frequency, for the MGNC-MWCNT coating. The results in FIG. 4B are typical of magnetic nanoparticles such as the ironic oxide MGNCs used for the coating.

Example 2

Simulation: Design and performance simulations were carried out by SOLIDWORKS 2016×64 edition and a finite element analysis tool, COMSOL Multiphysics 5.4. The simulations included evaluating the tilt angle θ at 0, 1, 2, 3 and 4°. Referring back to FIGS. 1C-1E, in an example, the dimensions of the honeycomb structure 10 are as follows: width W equal to 5 mm (as measured at or near the top 20); height H equal to 10 mm, wall thickness $T_W$ equal to 1 mm, and base layer thickness $T_{BL}$ at 7 mm. A total height of the structure, which includes the base layer 16 and the honeycomb cells 12, is thus equal to 17 mm (10 mm+7 mm). In other examples, the total height can be more or less than 17 mm.

Figure 5A:
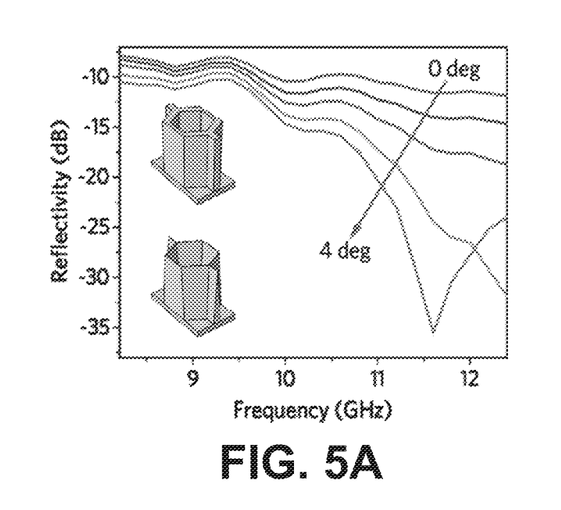
FIG. 5A is a simulated plot of reflectivity as a function of frequency for honeycomb structures having a tilt angle at 0, 1, 2 3 and 4 degrees.

FIG. 5A is a simulated plot of reflectivity as a function of frequency for honeycomb structures having a tilt angle θ at 0, 1, 2 and 4 degrees. Because reflection loss is expressed as a negative number, a lower value (i.e., further from zero) equates to better performance. The frequency range of 8.2 to 12.4 GHz can be referred to herein as the X-band range, which is the radar frequency focused on here. It is recognized that the frequency range can be expanded, such as, for example, 1 GHz to 50 GHz.

The results in FIG. 5A illustrate that for a honeycomb structure having walls with uniform thickness (θ at 0°), the reflection loss is essentially constant as a function of frequency. FIG. 5A illustrates that, as the tilt angle θ increases, there is a decrease in reflectivity at higher frequencies. At a tilt angle of 4 degrees, there is a dramatic dip in reflectivity (at about 11.5 GHz), which shows superior performance of the tilted honeycomb structure.

Figure 5B:
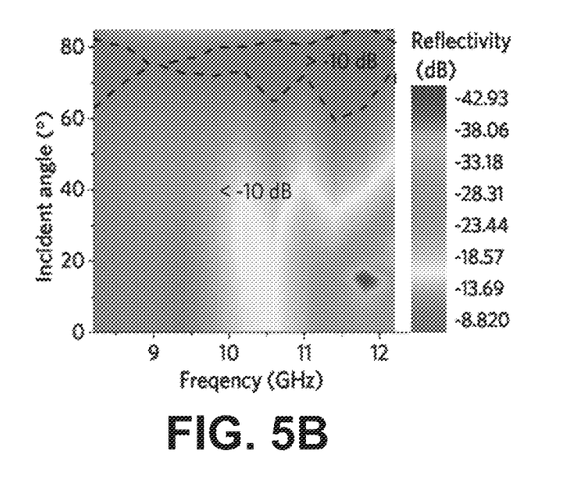
FIG. 5B is a simulated plot of incidence angle as a function of frequency for TE wave of a honeycomb structure having a tilt angle at 4 degrees.
Figure 5C:
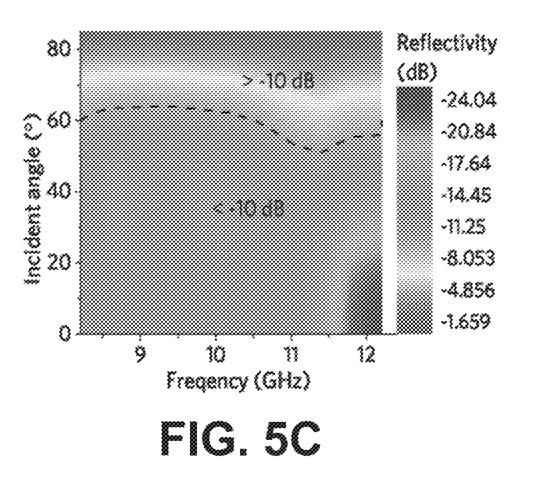
FIG. 5C is a simulated plot of incidence angle as a function of frequency for TM wave of a honeycomb structure having a tilt angle at 4 degrees.

FIG. 5B is a simulated plot of incidence angle as a function of frequency in the X-band range for transverse electric (TE) wave for a honeycomb structure with the tilt angle at 4°. FIG. 5C is a simulated plot of incident angle as a function of frequency in the X-band range for transverse magnetic (TM) wave for the honeycomb structure with the 4° tilt angle. For the TE wave, a reflection loss of more than −10 dB can be achieved in a wide incident angle from 0 to 60°, and the highest reflection loss can achieve −40 dB at an incident angle of 15° and frequency of 11.8 GHz. For the TM wave, there is a reflection loss of more than −10 dB within an incident angle of 10-50° and the maximum reflection loss can achieve more than −20 dB within the incident angle of 0-30° and frequency of 11.6-12.4 GHz. As compared to other honeycomb structures having a uniform sidewall thickness (non-gradient), the tilted honeycomb structures described herein exhibit a higher reflection loss for both TE and TM waves.

Figure 6A:
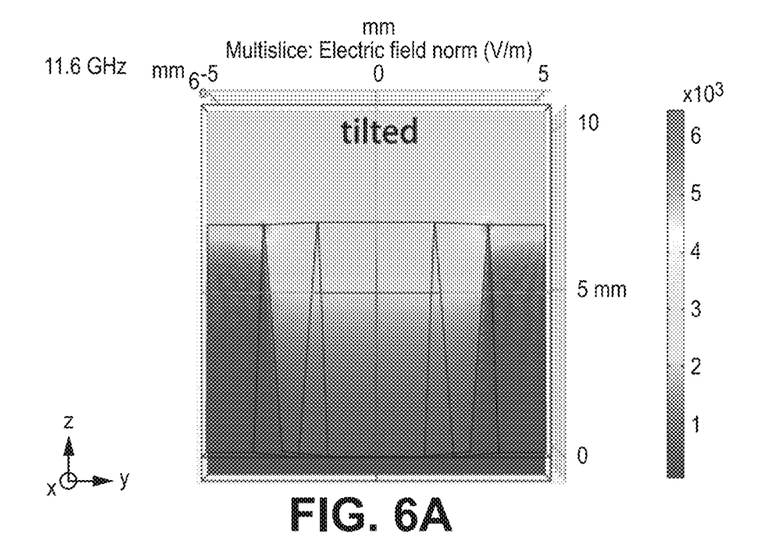
FIG. 6A is a simulated plot of the electric field distribution for a tilted or gradient honeycomb structure.
Figure 6B:
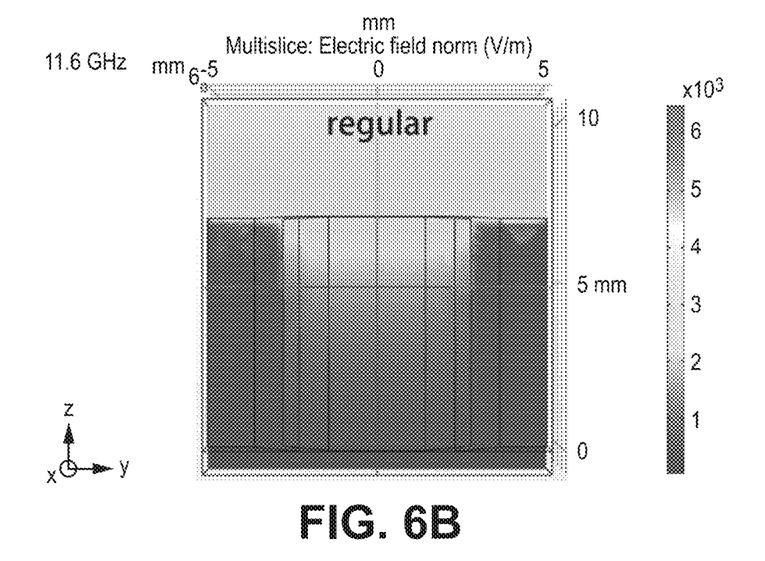
FIG. 6B is a simulated plot of the electric field distribution for a regular (non-gradient) honeycomb structure.

FIGS. 6A and 6B are simulated plots of the electric field distribution for the honeycomb structure with the 4° tilt angle and the regular honeycomb structure with uniform sidewall thickness, respectively. The maximum electric field for the tilted honeycomb structure of FIG. 6A is located at the top edge of the honeycomb and the wave goes deeper, as compared to the regular honeycomb structure of FIG. 6B. It is believed that the tilted honeycomb structure allows more electromagnetic waves into the structure, while the regular honeycomb structure reflects back more electromagnetic waves. Although it is believed that electromagnetic waves can reflect on any discontinuous interface (for example, air/honeycomb interface) due to an impedance mismatch, it is also believed that the tilted feature mitigates the discontinuous characteristic and thus leads to an improved reflection loss.

Example 3

Figure 7:
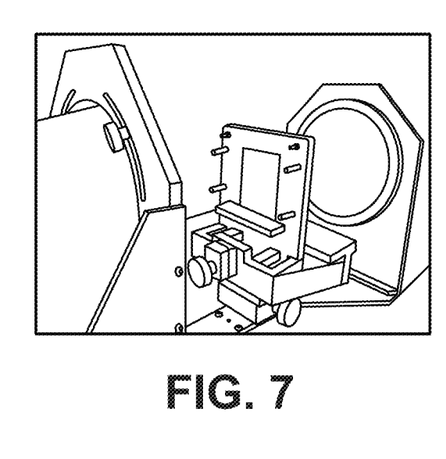
FIG. 7 is a photographic image of a free space measurement system for measuring reflection loss of the honeycomb structures described herein.

Shielding sample evaluation: An experimental study was conducted to validate the simulated results of FIGS. 5A-5C, 6A and 6B. FIG. 7 is a photograph of a free space measurement system used to generate transverse electromagnetic (TEM) waves for measuring reflection loss of the honeycomb structures. The system has a pair of antennas, a sample holder, a network analyzer and a computer for signal processing. Spot-focusing horn lens antennas are used to realize TEM waves in limited space and minimizing diffraction effects. An aluminum table, including the antennas and the sample holder, has a length and width of 1.83 m and 1.83 m, respectively. The table can be configured to receive a honeycomb structure sized at 140 mm by 140 mm. The network analyzer used was HP8722ES from the Hewlett-Packard Company.

The measurements of the S-parameters, which describe the electrical behavior of networks exposed to electrical signals, was conducted at 8.2-12.4 GHz wave frequency. The electromagnetic shielding (SE) of a material can be computed in terms of the following: Shielding by reflection, $SE_R$; Shielding by Absorption, $SE_A$; and Total Shielding, $SE_T$. Shielding can be defined in terms of the following coefficients: reflectance (R), absorbance (A) and transmittance (T). The R and T coefficients can be computed from magnitudes of measured S-parameters $S_{11}$ and $S_{21}$, as shown in Equation 1 below. The A coefficient can be obtained from Equation 2 below based on the law of energy conservation.

$$R = \frac{P_R}{P_I} = |S_{11}|^2, T = \frac{P_T}{P_I} = |S_{21}|^2 \quad (1)$$

$$A = 1 - R - T (P_I = P_R + P_A + P_T) \quad (2)$$

The powers of electromagnetic waves include incident $P_I$, reflected $P_R$, absorbed $P_A$, and transmitted $P_T$. Since $SE_T$ is defined as the transmitted powers in decibels (dB), it can be defined by the sum of $SE_R$ and $SE_A$ as shown in Equations 3-5 below.

$$SE_R = -10\log(1 - R) \quad (3)$$

$$SE_A = -10\log\frac{T}{(1-R)} \quad (4)$$

$$SE_T = -10\log T = -10\log(1-R) - 10\log\left(\frac{T}{1-R}\right) = SE_R + SE_A \quad (5)$$

Figure 8A:
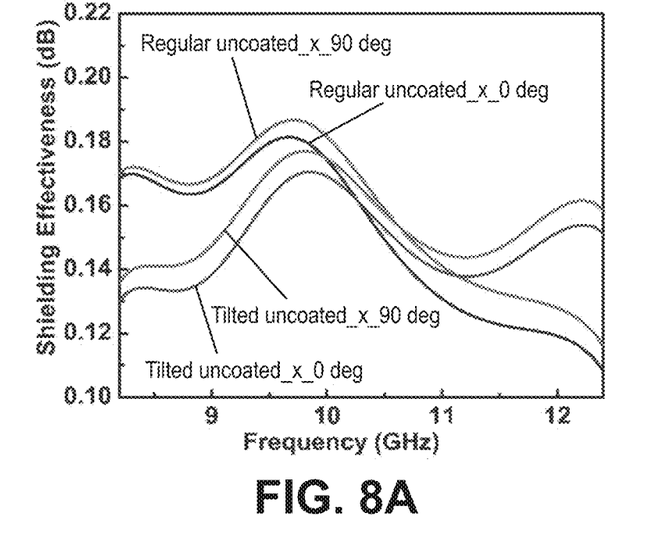
FIG. 8A is a plot of shielding effectiveness as a function of frequency for coated and uncoated honeycomb structures.
Figure 8B:
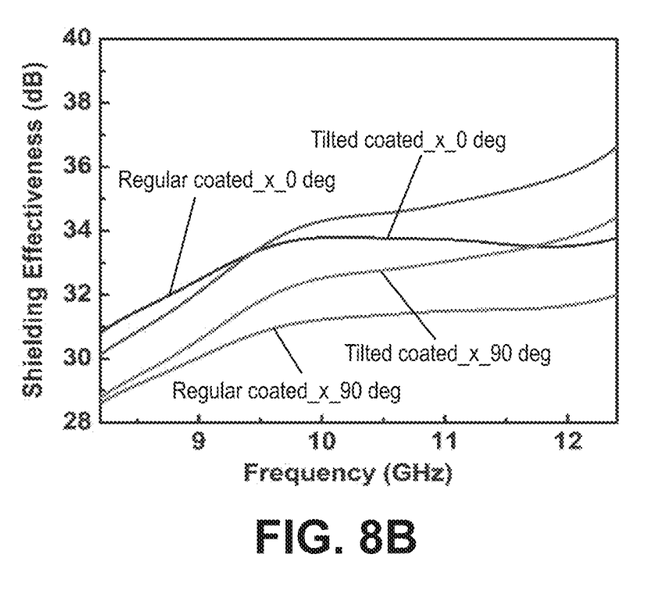
FIG. 8B is a plot of shielding effectiveness as a function of frequency for coated structures having a tilt/gradient design and a non-gradient design.

The shielding study was performed on four honeycomb structures: (1) regular, uncoated; (2) tilted, uncoated (tilt angle θ=4°); (3) regular, coated; and (4) tilted, coated. The coating was the MGNC-MWCNT coating described above and the tilt angle θ was equal to 4°. Both structures were studied at an incident wave angle of 0 and 90°. The shielding effectiveness of the uncoated samples are shown in FIG. 8A; the shielding effectiveness of the coated samples are shown in FIG. 8B. Although the tilted, uncoated structures were more effective relative to the regular, uncoated structures, both the regular and tilted, uncoated structures have negligible $SE_T$, given that the structure is made from nylon 12 (transparent and conductive), which is known for its poor shielding performance.

By contrast, all coated samples of FIG. 8B have much higher shielding effectiveness, as compared to the uncoated samples, and across the whole X-band range. For example, at 8.2 GHz, the $SE_T$ of the regular structure improved from 0.17 and 0.175 dB (uncoated) to 31 and 29 dB (coated). In contrast to the uncoated samples of FIG. 8A, shielding effectiveness of the coated samples increased as a function of frequency. The significant improvement in $SE_T$ for the two coated structures (regular and tilted) can be attributed to the formation by the coating of a heterogeneous structure with multi-interfacial layers and gaps, thereby increasing the multi-reflection which improves shielding absorption. Moreover, the magnetic MGNCs in the coating accumulate charges at the interfaces of the structure because of interfacial polarization.

As shown in FIG. 8B, the tilted, coated structure at 0° incidence had a higher shielding effectiveness than the regular, coated structure at 0° incidence. Similarly, the tilted, coated structure at 90° had a higher shielding effectiveness than the regular, coated structure at 90°. In summary, the tilted, coated samples were most effective at shielding, both at 0 and 90° and across the X-band range.

Figure 9A:
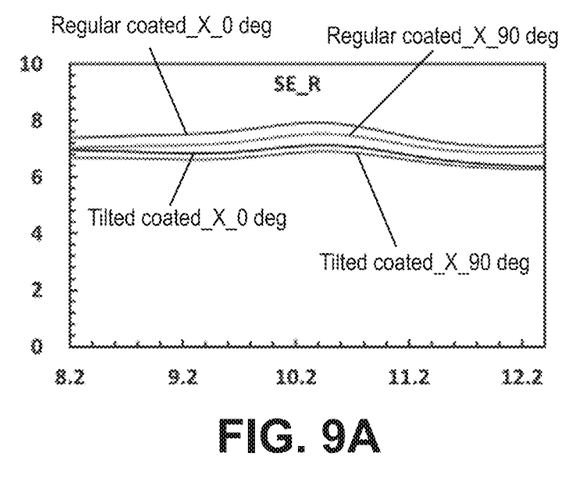
FIG. 9A is a plot of shielding by reflection as a function of frequency for the coated structures of FIG. 8B.
Figure 9B:
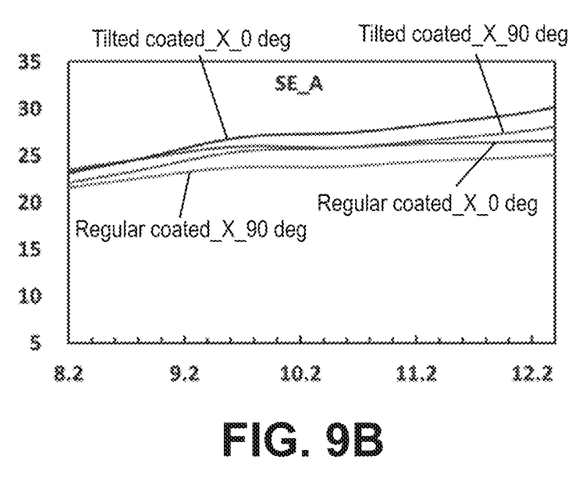
FIG. 9B is a plot of shielding by absorption as a function of frequency for the coated structures of FIG. 8B.

FIG. 9A shows the shielding by reflection, $SE_R$ for all coated samples of FIG. 8B. FIG. 9B shows the shielding by absorption, $SE_A$ for all coated samples of FIG. 8B. The tilted structure had lower $SE_R$ at 0 and 90° over the X-band range, as compared to the regular structure at 0 and 90°. Similarly, the tilted structure had better absorption $SE_A$ over the X-band range, as compared to the regular structure at 0 and 90°. The absorption increase and reflection decrease make the tilted, coated honeycomb structures suitable for radar cross-section reduction and stealth technology.

Thus, the scope of this disclosure should be determined by the appended claims and their legal equivalents. Therefore, it will be appreciated that the scope of the present disclosure fully encompasses other embodiments which may become obvious to those skilled in the art, and that the scope of the present disclosure is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present disclosure, for it to be encompassed by the present claims. Furthermore, no element, component, or method step in the present disclosure is intended to be dedicated to the public regardless of whether the element, component, or method step is explicitly recited in the claims.

The foregoing description of various preferred embodiments of the disclosure have been presented for purposes of illustration and description. It is not intended to be exhaustive or to limit the disclosure to the precise embodiments, and obviously many modifications and variations are possible in light of the above teaching. The example embodiments, as described above, were chosen and described in order to best explain the principles of the disclosure and its practical application to thereby enable others skilled in the art to best utilize the disclosure in various embodiments and with various modifications as are suited to the particular use contemplated. It is intended that the scope of the disclosure be defined by the claims appended hereto.

Various examples have been described. These and other examples are within the scope of the following claims.

What is claimed is:

1. A gradient honeycomb structure for absorbing electromagnetic waves, the honeycomb structure comprising:
   a honeycomb sheet formed by a plurality of interconnected hexagon cells arranged in rows, the hexagon cells made up of gradient sidewalls, each gradient sidewall having a thickness and a height, the height defined between a top and a bottom of the sidewall, the thickness of the sidewall defined between two surfaces of the sidewall and increasing along the height of the sidewall from the top to the bottom, the two surfaces that form the sidewall converging at the top of the sidewall to form an angle; and
   a magnetic coating applied to an exterior of the honeycomb sheet, the magnetic coating configured to increase electromagnetic shielding of the gradient honeycomb structure,
   wherein the gradient honeycomb structure exhibits decreased reflection and increased wave absorption, as compared to a non-gradient honeycomb structure.

2. The honeycomb structure of claim 1 further comprising a base layer connected to the honeycomb sheet.

3. The honeycomb structure of claim 1 wherein the magnetic coating is a composite of carbon nanotubes and nanoclusters.

4. The honeycomb structure of claim 3 wherein the composite comprises iron oxide ($Fe_3O_4$) multi-granular nanoclusters (MGNC).

5. The honeycomb structure of claim 3 wherein the composite comprises flakes of multi-walled carbon nanotubes (MWCNT).

6. The honeycomb structure of claim 1 wherein the angle is between about 2 degrees and about 10 degrees.

7. The honeycomb structure of claim 6 wherein the angle is about 8 degrees.

8. The honeycomb structure of claim 1 wherein a thickness of the magnetic coating is between about 150 and about 200 mm.

9. A device for electromagnetic wave absorption, the device comprising:
  a honeycomb structure formed of multiple rows of interconnected, hollow hexagon cells, the hexagon cells formed of a plurality of gradient sidewalls, each gradient sidewall having a top, a bottom, an exterior surface and an interior surface, a height of the sidewall defined between the top and bottom, a thickness of the sidewall defined between the exterior and interior surfaces, the exterior and interior surfaces converge at the top of the sidewall and diverge from the top to the bottom such that the thickness is variable and increases from the top to the bottom of the sidewall, an angle forms between the exterior and interior surfaces at the top of the sidewall, and the angle is about 8 degrees;
  a base layer attached to a bottom of the honeycomb structure; and
  a composite coating applied to the honeycomb structure and the base layer, the composite coating comprising magnetic multi-granular nanoclusters (MGNC) and multi-walled carbon nanotubes (MWCNT).

10. The device of claim 9 wherein the thickness of the sidewall at or near the bottom of the sidewall is about 1 mm.

11. The device of claim 9 wherein a size of each hexagon cell is defined by a space between opposite sidewalls, and the size is about 5 mm.

12. The device of claim 9 wherein the height of each gradient sidewall is about 10 mm and a thickness of the base layer is about 7 mm.

13. The device of claim 9 wherein a thickness of the magnetic coating is between about 150 and about 200 mm.

14. The device of claim 9 wherein the exterior and interior surfaces intersect at the top of the sidewall.

15. A method of forming a gradient, coated honeycomb structure for use in absorbing electromagnetic waves, the method comprising:
  forming a honeycomb sheet having multiple rows of cells, each row of cells having a plurality of interconnected, hexagon cells formed by multiple gradient sidewalls, each gradient sidewall having a thickness and a height, the height defined between a top and a bottom of the sidewall, the thickness of the sidewall defined between two surfaces of the sidewall and increasing along the height of the sidewall from the top to the bottom, and the two surfaces that form the sidewall converge at the top of the sidewall to form an angle between about 2 degrees and about 10 degrees; and
  coating the honeycomb sheet with a magnetic, composite coating configured to increase electromagnetic shielding of the honeycomb structure.

16. The method of claim 15 further comprising:
  forming a base layer for attachment to the honeycomb sheet; and
  coating the base layer with the magnetic, composite coating.

17. The method of claim 16 wherein the base layer is integrally formed with the honeycomb sheet.

18. The method of claim 15 wherein the honeycomb sheet is formed via 3D printing.

19. The method of claim 15 wherein the magnetic, composite coating comprises magnetic multi-granular nanoclusters (MGNC) and multi-walled carbon nanotubes (MWCNT).

20. The method of claim 15 wherein the angle is 8 degrees.

* * * * *